(12) United States Patent
Takahashi (10) Patent No.: US 8,331,172 B2
(45) Date of Patent: Dec. 11, 2012

(54) SEMICONDUCTOR INTEGRATED CIRCUIT (75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 157 days.

(21) Appl. No.: 12/987,690

(22) Filed: Jan. 10, 2011

(65) Prior Publication Data
US 2011/0170362 A1 Jul. 14, 2011

(30) Foreign Application Priority Data

Jan. 14, 2010 (JP) .................................. 2010-005918

(51) Int. Cl.
*G11C 7/00* (2006.01)
*G11C 7/10* (2006.01)
*G11C 5/06* (2006.01)
*G11C 8/00* (2006.01)

(52) U.S. Cl. ................ 365/189.18; 365/63; 365/189.02; 365/189.05; 365/230.03

(58) Field of Classification Search .............. 365/189.18
See application file for complete search history.

(56) References Cited

U.S. PATENT DOCUMENTS

| 5,586,078 | A | 12/1996 | Takase et al. |
| 7,120,081 | B2 * | 10/2006 | Lee ........................... 365/230.05 |
| 7,843,759 | B2 * | 11/2010 | Park ......................... 365/230.06 |

FOREIGN PATENT DOCUMENTS

JP 8-96571 (A) 4/1996

* cited by examiner

*Primary Examiner* — Son Mai
(74) *Attorney, Agent, or Firm* — Foley & Lardner LLP (57) ABSTRACT

Disclosed is a semiconductor integrated circuit in which the number of bus lines is reduced and current consumption during operation can be lessened. The semiconductor integrated circuit includes a circuit unit (e.g., a memory cell array plate) which is divided into a plurality of banks (bank 1, bank 2) and processes multiple bits of data; a plurality of input/output circuits which perform input and output of multiple bits of data; and a plurality of bus lines which provide electrical coupling between the respective data input/output circuits and the circuit unit. Among the bus lines, two or more bus lines laid to extend laterally along the horizontal sides of the banks and coupled to different banks include a common bus line adapted as a shared bus line into which the middle parts of the bus lines are merged.

9 Claims, 4 Drawing Sheets (1st EMBODIMENT)

FIG. 1 (1st EMBODIMENT)

FIG. 2 (1st EMBODIMENT)

(4th EMBODIMENT)

*FIG. 6*

(5th EMBODIMENT)

FIG. 7  (1st EXAMPLE OF RELATED ART)

FIG. 8  (2nd EXAMPLE OF RELATED ART)

SEMICONDUCTOR INTEGRATED CIRCUIT

CROSS-REFERENCE TO RELATED APPLICATIONS

The disclosure of Japanese Patent Application No. 2010-5918 filed on Jan. 14, 2010 including the specification, drawings and abstract is incorporated herein by reference in its entirety.

BACKGROUND

1. Field of the Invention

The present invention relates to a semiconductor integrated circuit including a plurality of bus lines providing coupling between a circuit unit and input/output circuits.

2. Description of Related Art

In a semiconductor integrated circuit, in order to improve the data processing capacity of a memory, bus lines tend to be broadened, because a sufficient improvement is not achieved only by increasing the operating frequency of the memory core. Especially, a memory macro incorporated in a logic chip is advantageous for realizing high performance and low power in terms of the fact that bus lines can be broadened, because such memory macro is not influenced by an interface (I/F) between product chips. On the other hand, memory capacity is growing more and more and a memory macro having a larger area adopts a manner in which a memory cell array plate is divided into a plurality of banks, one of which can be selected. The adoption of this manner is effective for reducing the power consumed by the memory cell array plate and achieving a higher rate. However, if data width (the number of bits) is large, an increasing number of bus lines will be required to intercouple the banks. There is a problem of an enlargement of a macro area due to limitation of wiring resources in an upper layer, not circuit elements. This problem is improved by increasing the number of wiring layers over the macro, which, however, anyway, results in a problem of cost increase. Some situations are encountered where current consumed by a bus wiring section exceeds that consumed by the memory plate. This poses another problem of growing of power consumption by bus wiring. The problem of growing of power consumption by bus wiring is currently addressed by design efforts in which as many bus lines as possible are laid with a minimum wiring pitch. If data width (the number of bits) and memory capacity further increase along these trends, it is predicted in future that the tradeoff problem between growing of power consumption due to an increase in wiring capacity and cost increase becomes more severe.

From the foregoing viewpoint, Japanese Unexamined Patent Publication No. Hei8 (1996)-96571 discloses a configuration in which memory blocks are divided into two banks (regions) and data lines (bus lines) which are used to switch between the two banks are laid in a vertical direction with respect to a row of input/output pads (I/O pads) and wired to extend over the memory blocks within the banks.

Figure 7:
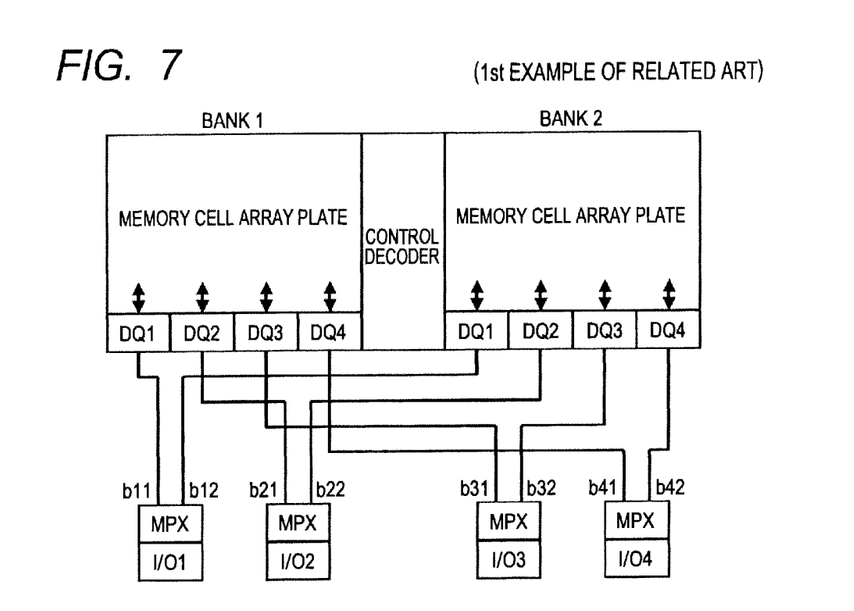
FIG. 7 is a circuit diagram schematically illustrating a configuration of a semiconductor integrated circuit pertaining to a first example of related art.

Japanese Unexamined Patent Publication No. Hei8 (1996)-96571 also discloses a configuration in which two banks are disposed in parallel with a row of I/O pads as an example of related art (see FIG. 7; a first example of related art). Here, bus lines are laid separately between each bank and each I/O pad and switching between the banks is performed by a multiplexer circuit (MPX circuit) attached to each I/O pad. In a case where the I/O pads are arranged alongside the entire horizontal dimension of the two banks, a bus wiring region (resources) large enough to wire the number of data buses to extend laterally along the horizontal sides of the two banks is required (bus wiring is depicted in FIG. 7 with the assumption that data width (the number of bits)=4 for simplicity).

Figure 8:
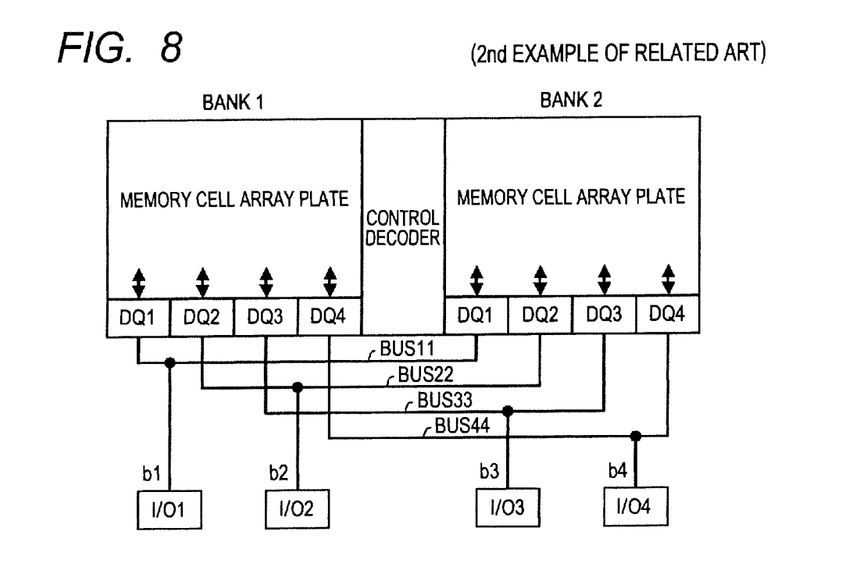
FIG. 8 is a circuit diagram schematically illustrating a configuration of a semiconductor integrated circuit pertaining to a second example of related art.

In addition, a data bus wiring configuration which is regarded as the most general one is shown in FIG. 8 as a second example of related art. Here, this wiring configuration includes common bus lines BUS11, BUS22, BUS33, BUS44 wired between two banks and shared for each data bit. Each of DQ1 to DQ4 is provided therein with a tristate buffer which switches over between enabling and disabling data transfer from/to it through the bus line terminated in it according to a bank selection.

SUMMARY

According to Japanese Unexamined Patent Publication No. Hei8 (1996)-96571, in the case where two banks are placed perpendicularly to the row of I/O pads, the addition of a wiring layer or the provision of a wiring space is needed to wire the bus lines to extend over the circuits of the memory blocks. In this case, a minimum of bus wiring resources amounts to "the number of data bits×the number of banks".

As in the first example of related art (see FIG. 7), even in the case where two banks are placed in parallel with the row of I/O pads, the number of bus lines corresponding to the number of data bits is needed at minimum. There is a need for allocating a region for wiring layout or adding an upper wring layer. Although data width is as small as four bits for simplicity in the case of FIG. 7, as the number of bits increases, the corresponding elements of I/O pads and MPX circuits would be accommodated in a lower layer under the bus wiring region, having little effect on area limitation. Moreover, in the first example of related art, separate bus lines exit to couple each bank and an I/O pad, which thus offers a merit of less consumption current during operation. However, as the number of banks increases, the number of bus lines increases; consequently, more wiring resources are needed, giving rise to a problem of cost increase.

Further, in the second example of related art (see FIG. 8), the number of common buses is equal to the number of data bits and, therefore, the same holds true for this case as for the first example of related art. In the second example of related art, MPX circuits are dispensed with in contrast to the first example of related art, but all the common bus lines BUS11, BUS22, BUS33, BUS44 are long wring, which thus results in an increase in current consumption during operating.

A main challenge of the present invention is to provide a semiconductor integrated circuit in which the number of bus lines is reduced and current consumption during operation can be lessened.

In addressing the challenge (developing the invention), the inventors considered what determines wiring resources for bus lines (on the assumption that the number of banks=2, herein). If the banks are disposed in parallel with the row of input/output circuits I/O, a half of input/output circuits I/O are placed near to the data buffer circuits DQ of bank 1, but far from bank 2, whereas the remaining half of input/output circuits I/O are placed near to the data buffer circuits DQ of bank 2, but far from bank 1. The number of bus lines wired in a region extending laterally along the horizontal sides of the banks is largest. Bus wires have to be wired horizontally in this region, since there is a situation where the corresponding input/output circuits I/O are not placed near to the selected bank (below the adjoining bank). Because a half of the input/output circuits I/O are located below each bank, "the number of input/output circuits I/O=data width" in total has been considered as a minimum number of required wiring resources. However, if a bank selection is taken into account, among the bus lines laid to extend laterally along the horizontal sides of the banks, the number of the bus lines that practically carry signals, i.e., that are in use at a time is always a half. Hence, if a bus line or lines being in use and a bus line or lines not being in use at a time can be merged in a shared bus line, the minimum required bus wiring resources, so far regarded as a limit, can be reduced by half. Thus, the inventors have achieved the invention that will be set forth below.

In a first aspect of the present invention, there is provided a semiconductor integrated circuit comprising a circuit unit which is divided into a plurality of banks and processes multiple bits of data; a plurality of input/output circuits which perform input and output of multiple bits of data; and a plurality of bus lines which provide electrical coupling between the respective data input/output circuits and the circuit unit, wherein, among the bus lines, two or more bus lines laid to extend laterally along the horizontal sides of the banks and coupled to different banks include a common bus line adapted as a shared bus line into which the middle parts of the bus lines are merged.

In the above semiconductor integrated circuit of the present invention, it is preferable that the circuit unit comprises a memory cell array in which memory cells, each holding one bit of data, are arrayed in a matrix, and the cell array is electrically coupled to the corresponding bus lines via a plurality of data buffer circuits disposed for each one of the bits.

In the above semiconductor integrated circuit of the present invention, it is preferable that each of the input/output circuits is electrically coupled to the corresponding two or more bus lines via a multiplexer circuit performing a switchover according to selection of one of the banks.

In the above semiconductor integrated circuit of the present invention, it is preferable that there are two ore more common bus lines having equal lengths out of the common bus lines.

In the above semiconductor integrated circuit of the present invention, it is preferable that there are two ore more common bus lines that do not contact with each other on a same horizontal line out of the common bus lines.

In a second aspect of the present invention, there is provided a semiconductor integrated circuit comprising, in a first region, a first cell array comprising a plurality of cells; a plurality of first local buses for data input to and output from the first cell array; and a first input/output unit which is fewer in number than the number of the first local buses, in a second region, a second cell array comprising a plurality of cells; a plurality of second local buses for data input to and output from the second cell array; and a second input/output unit which is fewer in number than the number of the second local buses, and, in a third region sandwiched between at least the first region and the second region, a common bus wire which provides coupling between a given one of the first local buses and the second input/output unit, when the first cell array is selected, and provides coupling between a given one of the second local buses and the first input/output unit, when the second cell array is selected, wherein the common bus line is fewer in number than the number of the first local buses and the second local buses in either case.

In the above semiconductor integrated circuit of the present invention, it is preferable that the number of the first local buses and the second local buses is two or more, respectively.

The above semiconductor integrated circuit of the present invention, preferably, further comprises a first switch which is disposed in the first region, couples a given one of the first local buses to the second input/output unit via the common bus line, and couples another given one of the first local buses to the first input/output unit, when the first cell array is selected; and a second switch which is disposed in the second region, couples a given one of the second local buses to the first input/output unit via the common bus line and couples another given one of the second local buses to the second input/output unit, when the second cell array is selected. Preferably, the second switch is controlled in a complementary fashion with respect to the first switch.

The above semiconductor integrated circuit of the present invention, preferably, further comprises a third switch which is disposed in the first region, does not couple a given one of the second local buses to the first input/output unit via the common bus line and couples another given one of the first local buses to the first input/output unit, when the first cell array is selected, and couples a given one of the second local buses to the first input/output unit via the common bus line and does not couple another given one of the first local buses to the first input/output unit, when the second cell array is selected; and a fourth switch which is disposed in the second region, does not couple a given one of the first local buses to the second input/output unit via the common bus line and couples another given one of the second local buses to the second input/output unit, when the second cell array is selected, and couples a given one of the first local buses to the first input/output unit via the common bus line and does not couple another given one of the second local buses to the second input/output unit, when the first cell array is selected.

According to the present invention, among bus lines extending laterally along the horizontal sides of the banks, the middle parts of a bus line or lines being used and a bus line or lines not being used at a time are merged into a shared bus line. In this way, it is possible to reduce by half the minimum required bus wiring resources, so far regarded as a limit. The invention also offers a solution to the tradeoff in which power consumption increases by reducing the bus lines. In consequence, an effect of reducing power consumption can also be expected.

DETAILED DESCRIPTION OF THE PREFERRED EMBODIMENTS

A semiconductor integrated circuit pertaining to a first embodiment of the present invention comprises a circuit unit (e.g., a memory cell array plate in FIG. 1) which is divided into a plurality of banks (bank 1 and bank 2 in FIG. 1) and processes multiple bits of data, a plurality of input/output circuits (I/O1 to I/O4 in FIG. 1) which perform input and output of multiple bits of data, and a plurality of bus lines (b11, b12, b21, b22, b31, b32, b41, b42 in FIG. 1) which provide electrical coupling between the data input/output circuits and the circuit unit. Among the bus lines, two or more bus lines (b12 and b31, b22 and b41 in FIG. 1) laid to extend laterally along the horizontal sides of the banks and coupled to different banks include a common bus line (BUS13, BUS24 in FIG. 1) adapted as a shared bus line into which the middle parts of the bus lines are merged.

A semiconductor integrated circuit pertaining to a first embodiment of the present invention comprises, in a first region (10 in FIG. 6), a first cell array (11 in FIG. 6) comprising a plurality of cells, a plurality of first local buses (12a, 12b in FIG. 6) for data input to and output from the first cell array, and a first input/output unit (15 in FIG. 6) which is fewer in number than the number of the first local buses, comprises, in a second region (20 in FIG. 6), a second cell array (21 in FIG. 6) comprising a plurality of cells, a plurality of second local buses (22a, 22b in FIG. 6) for data input to and output from the second cell array, and a second input/output unit (25 in FIG. 6) which is fewer in number than the number of the second local buses, and comprises, in a third region (30 in FIG. 6) sandwiched between at least the first region and the second region, a common bus line (31 in FIG. 6) which provides coupling between a given one of the first local buses and the second input/output unit when, the first cell array is selected, and provides coupling between a given one of the second local buses and the first input/output unit, when the second cell array is selected, wherein the common bus line is fewer in number than the number of the first local buses and the second local buses in either case.

First Embodiment

Figure 1:
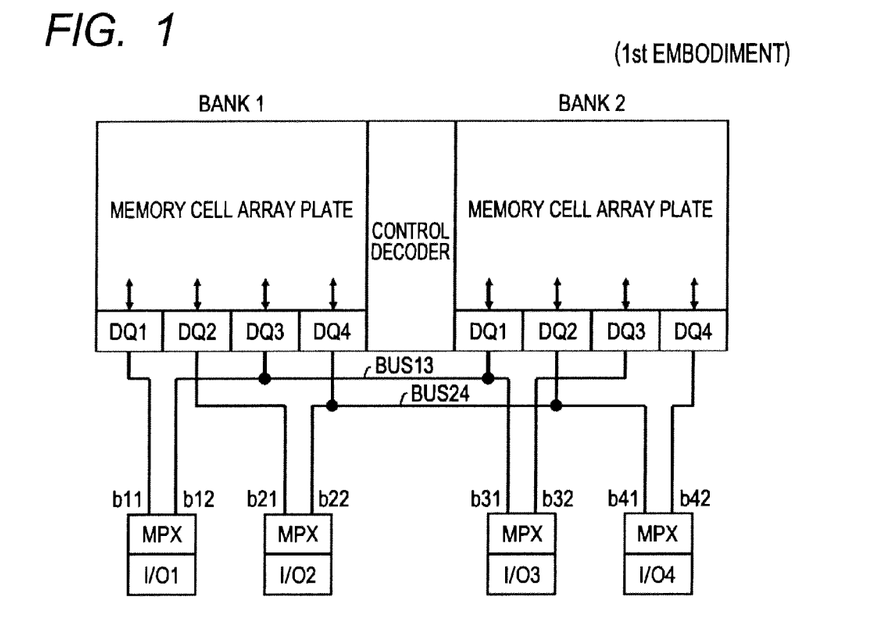
FIG. 1 is a circuit diagram schematically illustrating a configuration of a semiconductor integrated circuit pertaining to a first embodiment of the present invention.
Figure 2:
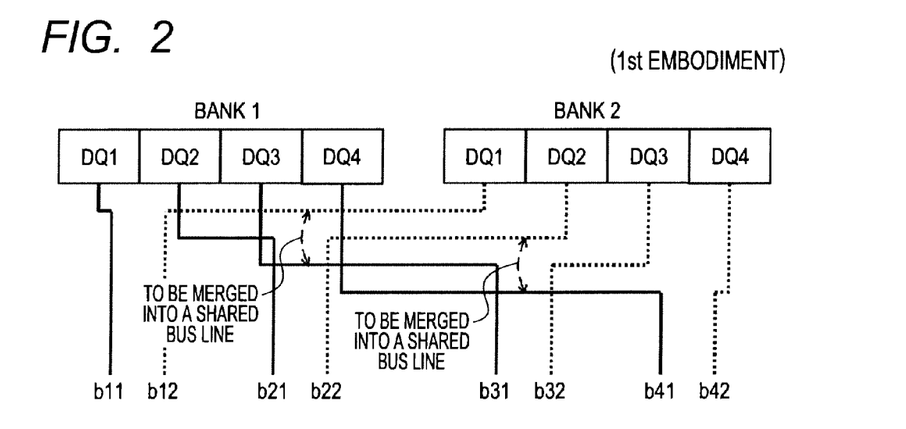
FIG. 2 is a layout diagram intended to explain shared bus lines used in the semiconductor integrated circuit pertaining to the first embodiment of the present invention.

The semiconductor integrated circuit pertaining to the first embodiment of the present invention is described using the relevant drawings. FIG. 1 is a circuit diagram schematically illustrating the configuration of the semiconductor integrated circuit pertaining to the first embodiment of the present invention. FIG. 2 is a layout diagram intended to explain shared bus lines used in the semiconductor integrated circuit pertaining to the first embodiment of the present invention.

Referring to FIG. 1, the semiconductor integrated circuit features a memory macro circuit with broad bus lines which is incorporated in a logic product. This semiconductor integrated circuit comprises a memory cell array plate, a control decoder, data buffer circuits DQ1 to DQ4, multiplexer circuits MPX, input/output circuits I/O1 to I/O4, and bus lines b11, b12, b21, b22, b31, b32, b41, b42.

The memory cell array plate is a plate in which memory cells (not shown), each holding one bit of data, are arrayed in a matrix. The memory cell array plate may comprise an aggregate of sub-array regions which are smaller in hierarchy. In the memory cell array plate, decoding circuits (not shown) which select a memory cell address, sense amplifiers (not shown) for reading data from a selected memory cell, and writing circuits (not shown) for writing data into a selected memory cell are arrayed, coordinated to cell pitches. The memory cell array plate has a rectangular plane region. The memory cell array plate is divided into two parts in a direction parallel to a row of the input/output circuits I/O1 to I/O4. One divided part (right in FIG. 1) of the memory array plate is referred to bank 1 and the other divided part (left in FIG. 1) of the memory array plate is referred to bank 2.

The control decoder is a part which controls the decoding circuits in bank 1 and bank 2 of the memory array plate and placed between bank 1 and bank 2.

The data buffer circuits DQ1 to DQ4 are circuits performing data input and output internal to the memory cell array plate. The data buffer circuits DQ1 to DQ4 as many as the number of data bits are disposed on one horizontal side (lower side in FIG. 1) of the region of each of bank 1 and bank 2. Although the number of data bits is usually numerous (on the order of 100 to 1000 bits) in practical application, four bits are assumed to be stored for simplicity in the example of FIG. 1. A data buffer circuit DQ1 of each bank (bank 1 and bank 2) is electrically coupled to an input/output circuit I/O1 via the corresponding bus line (b11, b12) and multiplexer circuit MPX. Likewise, data buffer circuits DQ2 to DQ4 are electrically coupled to the corresponding input/output circuits I/O2 to I/O4 via the corresponding bus lines (b21, b22, b31, b32, b41, b42) and multiplexer circuits MPX.

The multiplexer circuits MPX are circuits for switching between bank 1 and bank 2, based on bank selection information and disposed in proximity to the input/output circuits I/O1 to I/O4. For example, the multiplexer circuit MPX of the input/output circuit I/O1 couples the I/O1 to the bus line b11 when bank 1 is selected and couples the I/O1 to the bus line b12 when bank 2 is selected and establishes a data transmission path. The multiplexer circuits MPX of the input/output circuits I/O2 to I/O4 operate similarly.

The input/output circuits I/O1 to I/O4 are circuits performing macro data input and output. The input/output circuits I/O1 to I/O4 are arranged in order along one horizontal side (lower side) of the whole memory plate. The input/output circuits I/O1, I/O2 are disposed below bank 1. The input/output circuits I/O3, I/O4 are disposed below bank 2.

The bus lines b11, b12, b21, b22, b31, b32, b41, b42 are transmission lines for transferring data between the corresponding data buffer circuits DQ1 to DQ4 of bank 1 and bank 2 and the multiplexer circuits MPX of the corresponding input/output circuits I/O1 to I/O4. In particular, a bus line b11 provides coupling between the data buffer circuit DQ1 of bank 1 and the multiplexer circuit MPX of the input/output circuit I/O1. A bus line b12 provides coupling between the data buffer circuit DQ1 of bank 2 and the multiplexer circuit MPX of the input/output circuit I/O1. A bus line b21 provides coupling between the data buffer circuit DQ2 of bank 1 and the multiplexer circuit MPX of the input/output circuit I/O2. A bus line b221 provides coupling between the data buffer circuit DQ2 of bank 2 and the multiplexer circuit MPX of the input/output circuit I/O2. A bus line b31 provides coupling between the data buffer circuit DQ3 of bank 1 and the multiplexer circuit MPX of the input/output circuit I/O3. A bus line b32 provides coupling between the data buffer circuit DQ3 of bank 2 and the multiplexer circuit MPX of the input/output circuit I/O3. A bus line b41 provides coupling between the data buffer circuit DQ4 of bank 1 and the multiplexer circuit MPX of the input/output circuit I/O4. A bus line b42 provides coupling between the data buffer circuit DQ4 of bank 2 and the multiplexer circuit MPX of the input/output circuit I/O4.

Among the bus lines b11, b12, b21, b22, b31, b32, b41, b42, bus lines b11 and b21 exist separately, because they are wired to the input/output circuits I/O1 and I/O2 disposed below bank 1. Likewise, bus lines b32 and b42 exist separately, because they are wired to the input/output circuits I/O3 and I/O4 disposed below bank 2.

Among the bus lines b11, b12, b21, b22, b31, b32, b41, b42, as for given sets of bus lines b12, b22, b31, b41 wired to extend laterally along the horizontal sides of bank 1 and bank 2, their middle parts are merged into a shared bus line. For example, the middle parts of the bus line b12 and the bus line b31 are merged into a common bus line BUS13. The middle parts of the bus line 22 and the bus line b41 are merged into a common bus line BUS24. Consequently, the number of bus lines in a region where the bus lines extend laterally along the horizontal sides of bank 1 and bank 2 becomes two in the example of FIG. 1. Reduction of bus lines to half of the data width (the number of bits)=4 can be accomplished.

Then, referring to FIG. 2, the diagram depicts bus wiring in a state where the bus lines b11, b12, b21, b22, b31, b32, b41, b42 wired from the input/output circuits I/O1 and I/O2 located below bank 1 and the input/output circuits I/O3 and I/O4 located below bank 2 to each of the data buffer circuits DQ1 to DQ4 of bank 1 and bank 2 are not merged into a shared bus line. The bus lines b11, b21, b31, b41 wired to the data buffer circuits DQ1 to DQ4 of bank 1 are depicted as solid lines and the bus lines b12, b22, b32, b42 wired to the data buffer circuits DQ1 to DQ4 of bank 2 are depicted as dotted lines. It is understandable that dotted bus lines b12 and b22 and solid bus lines b31 and b41 laid in the region where the bus lines extend laterally along the horizontal sides of bank 1 and bank 2 can be merged into a shared bus line, respectively. When sets of bus lines that can be merged (e.g., a set of bus lines b12 and b31 and a set of bus lines b22 and b41) are set in accordance with an alignment sequence from right to left in the arrangement of the input/output circuits I/O1 to I/O4 which are located near to either of the bank regions, the common bus lines BUS13, BUS24 become shortest and equal in length, as in FIG. 1. Furthermore, this setting of the sets of bus lines can prevent overlapping with separate bus lines b11, b21, b32, b42 which do not extend laterally along the horizontal sides of bank 1 and bank 2. Thus, the entire region where the bus lines are laid can be shrunk to half of the wiring resources (space) (half in a vertical direction in FIG. 1).

If equal lengths of common bus lines need not be taken into account, alternative sets of bus lines may be selected; i.e., the middle parts of a bus line b12 and a bus line b41 may be merged into a shared bus line and the middle parts of a bus line b22 and a bus line b31 may be merged into a shared bus line.

Then, descriptions are provided for how the semiconductor integrated circuit pertaining to the first embodiment of the present invention operates.

First, a read operation is described. Either bank 1 or bank 2 is selected by an input address request. Four bits of data in data width are simultaneously read from memory cells in the memory cell array plate of the selected bank and output through the input/output circuits I/O1 to I/O4.

If, for example, bank 1 is selected, the memory cell array plate of bank 1 is activated and the data buffer circuits DQ1 to DQ4 outputs read data to the bus lines b11, b21, b31, b41. At this time, because bank 2 is in an inactive state, the outputs of the data buffer circuits DQ1 to DQ4 of bank 2 are off. The multiplexer circuits MPX attaching to each of the input/output circuits I/O1 to I/O4 pass signals on the bus lines bx1 (x is a number from 1 to 4) wired to bank 1 to the input/output circuits I/O1 to I/O4 and do not pass signals on the bus lines bx2 (x is a number from 1 to 4) wired to bank 2 to the input/output circuits I/O1 to I/O4. An output signal from a data buffer circuit DQ3 of bank is transmitted through the common bus line BUS13. Then, this signal is correctly transferred to an input/output circuit I/O3, because, at this time, the multiplexer circuit MPX of the input/output circuit I/O3 couples the bus line B31 to the I/O3, the data buffer circuit DQ1 of bank 2 outputs no signal, and the multiplexer circuit MPX of the input/output circuit I/O1 decouples the bus line b12 from the I/O1. In a similar manner, an output signal from a data buffer circuit DQ4 of bank 1 is correctly transferred to an input/output circuit I/O4 through the common bus BUS24.

If bank 2 is selected, the outputs of the data buffer circuits DQ1 to DQ4 of bank 1 are off and the multiplexer circuits MPX decouple the bus lines bx1 (x is a number from 1 to 4) wired to bank 1. Thus, output signals from data buffer circuits DQ1 and DQ2 of bank 2 are transferred to the corresponding input/output circuits I/O1 and I/O2 through the common bus lines BUS13 and BUS24.

In other words, the common bus line BUS13 is used for transferring data to the input/output circuit I/O3 when bank 1 is selected and used for transferring data to the input/output circuit I/O1 when bank 2 is selected.

Meanwhile, in a write operation, data to be written is transmitted from the input/output circuits I/O1 to I/O4 toward the memory cell array plate. That is, in the write operation, although the direction of data transmission is reverse to that in the read operation, the multiplexer circuits MPX and the bus lines b11, b12, b21, b22, b31, b32, b41, b42 are used in the same way as in the read operation.

According to the first embodiment, it is assumed to read and write multiple bits of data in the circuit configuration in which the memory cell array plate is divided into a plurality of banks, as for given sets of bus lines wired to extend laterally along the horizontal sides of the banks, their middle parts are merged into shared bus lines. Thereby, the bus wiring resources for coupling between the row of input/output circuits and the banks are reduced. As a result of the reduction of the bus wiring resources, it is possible to reduce costs by area shrinkage or a decrease in the number of wiring layers. This embodiment of the invention also offers a solution to the tradeoff in which power consumption increases by reducing the bus lines and, in consequence, an effect of reducing power consumption can also be expected.

Second Embodiment

Figure 3:
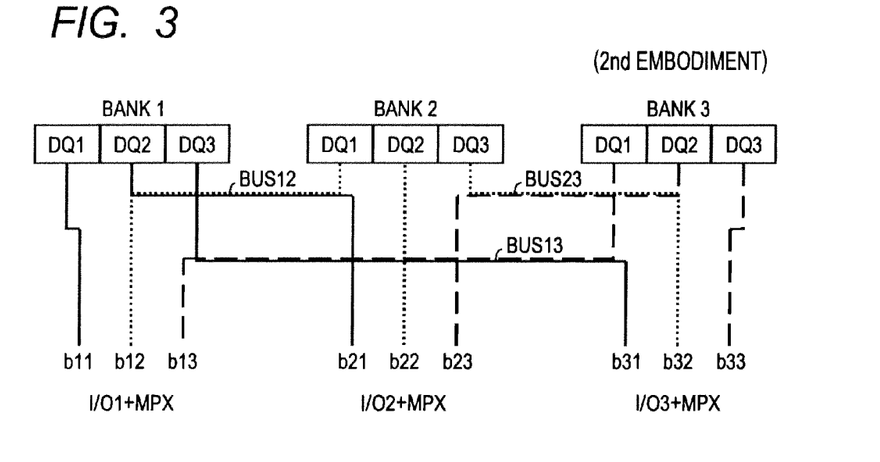
FIG. 3 is a layout diagram schematically illustrating a circuit configuration around bus wiring in a semiconductor integrated circuit pertaining to a second embodiment of the present invention.

A semiconductor integrated circuit pertaining to a second embodiment of the present invention is described using the relevant drawing. FIG. 3 is a layout diagram schematically illustrating a circuit configuration around bus wiring in the semiconductor integrated circuit pertaining to the second embodiment of the present invention.

The second embodiment is an example where three banks are provided, each bank stores three bits, and the middle parts of a given set of two bus lines are margined into a shared bus line. In FIG. 3, data width (the number of bits) is assumed to be three to simplify explanation and input/output circuits I/O1 to I/O3 are disposed in separate locations near to (below) banks 1 to 3, respectively. In particular, below bank 1, an input/output circuit I/O1 and its multiplexer circuit MPX are placed. Below bank 2, an input/output circuit I/O2 and its multiplexer circuit MPX are placed. Below bank 3, an input/output circuit I/O3 and its multiplexer circuit MPX are placed. In FIG. 3, the memory cell array plate of banks 1 to 3 and control decoders are omitted.

The multiplexer circuit MPX of the input/output circuit I/O1 is coupled to a data buffer circuit DQ1 of bank 1 through a bus line b11, to a data buffer circuit DQ1 of bank 2 through a bus line b12, and to a data buffer circuit DQ1 of bank 3 through a bus line b13. The multiplexer circuit MPX of the input/output circuit I/O2 is coupled to a data buffer circuit DQ2 of bank 1 through a bus line b21, to a data buffer circuit DQ2 of bank 2 through a bus line b22, and to a data buffer circuit DQ2 of bank 3 through a bus line b23. The multiplexer circuit MPX of the input/output circuit I/O3 is coupled to a data buffer circuit DQ3 of bank 1 through a bus line b31, to a data buffer circuit DQ3 of bank 2 through a bus line b32, and to a data buffer circuit DQ3 of bank 3 through a bus line b33.

The multiplexer circuits MPX have three switches to select one of bus lines bx1, bx2, bx3 (x is a number from 1 to 3) from the banks 1 to 3.

Following the idea of the first embodiment in which, as for given sets of bus lines wired to extend laterally along the horizontal sides of two banks, their middle parts are merged into a shared bus line, this idea is applied to given two banks of the three banks and the middle parts of a given set of bus lines are merged into a shared bus line. The wiring configuration in FIG. 3 includes a common bus line B12 into which the middle parts of a bus line b12 and a bus line b21 laid to extend laterally along the horizontal sides of bank 1 and bank 2 are merged. The wiring configuration also includes a common bus line B23 into which the middle parts of a bus line b23 and a bus line b32 laid to extend laterally along the horizontal sides of bank 2 and bank 3 are merged. The wiring configuration also includes a common bus line B13 into which the middle parts of a bus line b13 and a bus line b31 laid to extend laterally along the horizontal sides of bank 1 and bank 3 are merged.

Because the common bus line BUS12 and the common bus line 23 do not overlap with each other in the layout in a vertical direction of FIG. 3 (do not contact with each other on a same horizontal line), two horizontal wiring lines are only required as bus wiring resources. There are four horizontal wiring lines in the first example of related art (see FIG. 7) and there are four horizontal wiring lines also in the second example of related art (see FIG. 8). The wiring resources can be reduced less than the minimum wiring space in conventional bus wiring corresponding to data width (the number of bits)=4.

Here, a problem in which charging and discharging current due to parasitic capacitance of bus wiring has a large influence on operating current is also considered to explain the significance of the second embodiment. In the second embodiment, there is a difference in the lengths of three common bus lines BUS12, BUS23, BUS13 (however, the common bus lines BUS12, BUS23 can have equal lengths). If bank 1 or bank 3 is selected, one long line (common bus line BUS13) and one short line (common bus line BUS12 if bank is selected or common bus line BUS23 if bank 3 is selected) are used, whereas the other short line (common bus line BUS 23 if bank is selected or common bus line BUS12 if bank 3 is selected) is not used. If bank 2 is selected, two short lines (common bus lines BUS12 and BUS23) are only used, but the long line (common bus line BUS13) is not used. This results in the same as in the case of the first example of related art (see FIG. 7). On the other hand, in the second example of related art (see FIG. 8), long common bus lines BUS11, BUS22, BUS33, BUS44 are always used and, therefore, there is a need for consumption power about two times as much as in the case of the second embodiment. If the first example of related art is applied to a configuration including more than two banks, taking advantage of its low power consumption design, it may result in an increase in bus wiring resources (requiring more space for bus wiring depending on data width (the number of bits)) and entail a significant cost increase. However, by using the second embodiment, low power consumption is accomplished and, moreover, wiring lines can be reduced fewer than the wiring lines in the second example of related art requiring the minimum wiring resources until now. That is, according to the second embodiment, it is possible to accomplish low power consumption and reducing the number of wiring lines at the same time.

Third Embodiment

Figure 4:
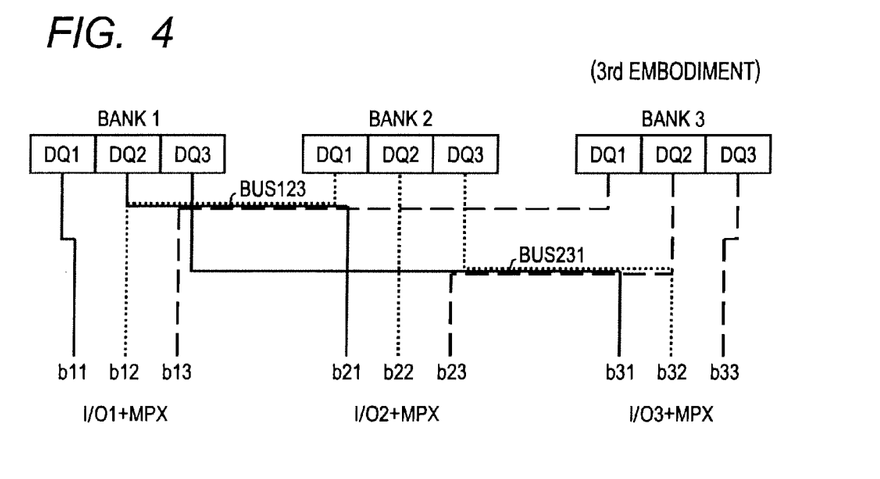
FIG. 4 is a layout diagram schematically illustrating a circuit configuration around bus wiring in a semiconductor integrated circuit pertaining to a third embodiment of the present invention.

A semiconductor integrated circuit pertaining to a third embodiment of the present invention is described using the relevant drawing. FIG. 4 is a layout diagram schematically illustrating a circuit configuration around bus wiring in the semiconductor integrated circuit pertaining to the third embodiment of the present invention.

The third embodiment is an example where three banks are provided, each bank stores three bits, and the middle parts of a given set of three bus lines are margined into a shared bus line. That is, the third embodiment is the same as the second embodiment (see FIG. 3) wherein the number of banks=3 and data width (the number of bits)=3, but suggests a different manner of merging bus lines into a share bus line. The middle part of a bus line b13 which is used when bank 3 is selected is removed from the common bus line BUS13 and added to the common bus line BUS12 shown in the second embodiment. In this way, a common bus line BUS123 wired to all the three banks is provided. Likewise, the middle part of a bus line b31 which is used when bank 1 is selected is removed from the common bus line BUS13 and added to the common bus line BUS 23 shown in the second embodiment. In this way, a common bus line BUS231 wired to all the three banks is provided. In the third embodiment, bus wiring space in which two horizontal wiring lines only can be wired is required, as in the second embodiment. Other details of configuration are the same as the second embodiment.

According to the third embodiment, in contrast to the second embodiment, because there are only two common bus lines BUS123 and BUS231 having equal lengths, wiring layout and timing design are simplified.

Fourth Embodiment

Figure 5:
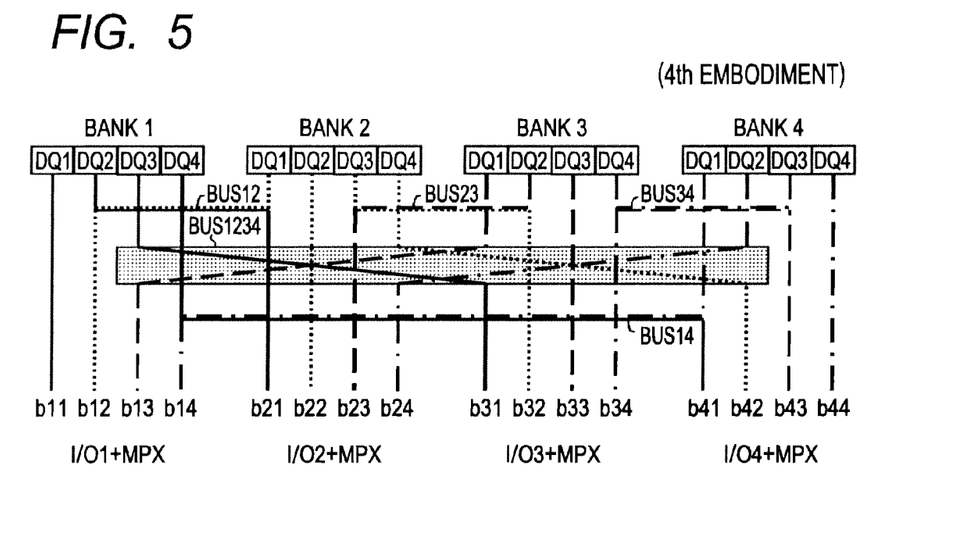
FIG. 5 is a layout diagram schematically illustrating a circuit configuration around bus wiring in a semiconductor integrated circuit pertaining to a fourth embodiment of the present invention.

A semiconductor integrated circuit pertaining to a fourth embodiment of the present invention is described using the relevant drawing. FIG. 5 is a layout diagram schematically illustrating a circuit configuration around bus wiring in the semiconductor integrated circuit pertaining to the fourth embodiment of the present invention.

The fourth embodiment foresees a case where the number of banks has increased with an increase in memory capacity. In FIG. 5, to simplify explanation, it is assumed that four banks are provided, each bank stores four bits, the middle parts of a given set of two or four bus lines are merged into a shared bus line, and input/output circuits I/O1 to I/O4 are disposed in separate locations near to (below) the regions of banks 1 to 4, respectively. In particular, below bank 1, an input/output circuit I/O1 and its multiplexer circuit MPX are placed. Below bank 2, an input/output circuit I/O2 and its multiplexer circuit MPX are placed. Below bank 3, an input/output circuit I/O3 and its multiplexer circuit MPX are placed. Below bank 4, an input/output circuit I/O4 and its multiplexer circuit MPX are placed. In FIG. 5, the memory cell array plate of banks 1 to 4 and control decoders are omitted.

The multiplexer circuit MPX of the input/output circuit I/O1 is coupled to a data buffer circuit DQ1 of bank 1 through a bus line b11, to a data buffer circuit DQ1 of bank 2 through a bus line b12, to a data buffer circuit DQ1 of bank 3 through a bus line b13, and to a data buffer circuit DQ1 of bank 4 through a bus line b14. The multiplexer circuit MPX of the input/output circuit I/O2 is coupled to a data buffer circuit DQ2 of bank 1 through a bus line b21, to a data buffer circuit DQ2 of bank 2 through a bus line b22, to a data buffer circuit DQ2 of bank 3 through a bus line b23, and to a data buffer circuit DQ2 of bank 4 through a bus line b24. The multiplexer circuit MPX of the input/output circuit I/O3 is coupled to a data buffer circuit DQ3 of bank 1 through a bus line b31, to a data buffer circuit DQ3 of bank 2 through a bus line b32, to a data buffer circuit DQ3 of bank 3 through a bus line b33, and to a data buffer circuit DQ3 of bank 4 through a bus line b34. The multiplexer circuit MPX of the input/output circuit I/O4 is coupled to a data buffer circuit DQ4 of bank 1 through a bus line b41, to a data buffer circuit DQ4 of bank 2 through a bus line b42, to a data buffer circuit DQ4 of bank 3 through a bus line b43, and to a data buffer circuit DQ4 of bank 4 through a bus line b44.

The multiplexer circuits MPX have four switches to select one of bus lines bx1, bx2, bx3, bx4 (x is a number from 1 to 4) from the banks 1 to 4.

In the fourth embodiment based on the same idea for the first to third embodiments, the middle parts of bus lines wired to extend laterally along the horizontal sides of two banks are merged into a shared bus line. The wiring configuration includes a common bus line B12 into which the middle parts of a bus line b12 and a bus line b21 laid to extend laterally along the horizontal sides of bank 1 and bank 2 are merged. The wiring configuration also includes a common bus line B23 into which the middle parts of a bus line b23 and a bus line b32 laid to extend laterally along the horizontal sides of bank 2 and bank 3 are merged. The wiring configuration also includes a common bus line B34 into which the middle parts of a bus line b43 and a bus line b34 laid to extend laterally along the horizontal sides of bank 3 and bank 4 are merged. The wiring configuration also includes a common bus line B14 into which the middle parts of a bus line b14 and a bus line b41 laid to extend laterally along the horizontal sides of bank 1 and bank 4 are merged. The wiring configuration further includes a common bus line BUS1234 into which the middle parts of four bus lines, namely, bus lines b31, b13 laid to extend laterally along the horizontal sides of bank 1 and bank 3 and bus lines b42, b24 laid to extend laterally along the horizontal sides of bank 2 and bank 4 are merged.

Common bus lines BUS12, BUS23, BUS34 can be implemented as short common bus lines and using a single horizontal line of wiring resources, as they do not overlap with each other in a vertical direction of FIG. 5. However, as for bus lines b13, b24, b31, b42, if the middle parts of a given set of two bus lines are merged into a shared bus line, two common bus lines and two horizontal lines of wiring resources are needed, i.e., a total of four horizontal lines of wiring resources are needed. Nevertheless, because one of the bus lines b13, b24, b31, b42 is only used when a bank is selected, the middle parts of the bus lines b13, b24, b31, b42 can be merged into a single common bus line as the common bus line BUS1234 (the hatched region in FIG. 5 corresponds to the common bus line). Thus, a reduction to a total of three horizontal lines of wiring resources is feasible.

To support the wiring method of the fourth embodiment, a general expression for calculating the amount of bus wiring resources required as the number of banks increases is provided as in [Equation 1] below. Wiring resources constantly less than those used in the examples of related art can be achieved.

$$\text{Number of horizontal lines of bus wiring resources} = n \times (m-1)/m,$$ [Equation 1]

where n=the number of bits and m=the number of banks.

The "number of horizontal lines of bus wiring resources" in [Equation 1] is a minimum number of horizontal lines of bus wiring resources required in a bus wiring region on the assumption that n pieces of input/output circuits are distributed evenly near to (below) m pieces of banks.

Given that four banks are provided and each bank stores four bits, eight horizontal lines of wiring resources are needed in the wiring method of the first example of related art (see FIG. 7) and four horizontal lines of wiring resources are need even in the wiring method of the second example of related art (see FIG. 8). According to the fourth embodiment, the wiring resources are reduced less than a half (three horizontal lines in FIG. 5) of the number of horizontal lines required in the first example of related art which is suitable for low power consumption.

In the present invention, if the number of bits is not divided integrally by the number of banks and/or if the input/output circuits I/O are not disposed evenly, it is also possible to apply any of the wiring methods of the present invention (the first to fourth embodiments) to a limited region where such wiring method is applicable and to use the wiring method of one of the examples of related art in the remaining region(s). That is, it is possible to combine the present invention with a conventional bus driving circuit configuration, although the effect differs depending on data width (the number of bits) and the number of banks.

The first to fourth embodiments have been described for the case where a plurality of banks are disposed horizontally with respect to the row of input/output circuits I/O. Even in a case where a plurality of banks are disposed in a matrix in a direction vertical to the row of input/output circuits I/O, any of the wiring methods of the present invention (the first to fourth embodiments) can be applied for merging the horizontally extending middle parts of bus lines into a shared bus line.

The semiconductor integrated circuit configurations pertaining to the present invention can be applied to any type of memory, because bus wiring is always needed for any circuit unit comprised of multiple banks for processing multiple bits of data. The semiconductor integrated circuit configurations pertaining to the present invention (the first to fourth embodiments) can be applied even in a processing circuit having a certain function other than a memory, because bus wiring exits in any configuration comprising input/output circuits I/O for multiple bits and a plurality of banks.

Fifth Embodiment

Figure 6:
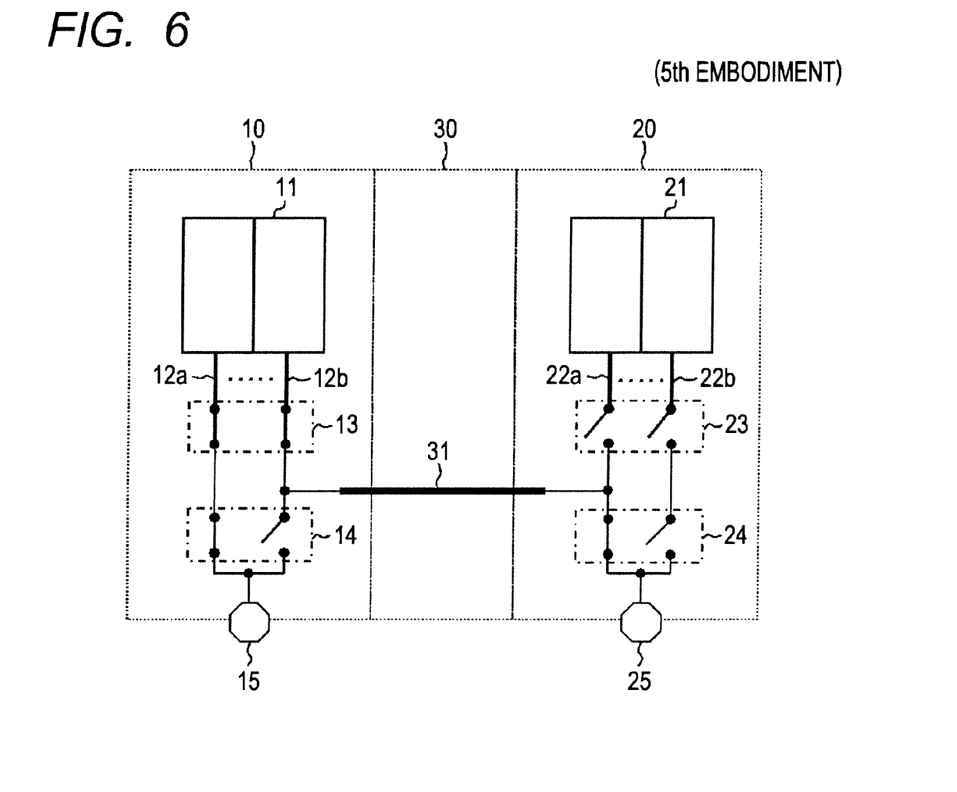
FIG. 6 is a circuit diagram schematically illustrating a configuration of a semiconductor integrated circuit pertaining to a fifth embodiment of the present invention.

A semiconductor integrated circuit pertaining to a fifth embodiment of the present invention is described using the relevant drawing. FIG. 6 is a circuit diagram schematically illustrating the configuration of the semiconductor integrated circuit pertaining to the fifth embodiment of the present invention.

In the semiconductor integrated circuit pertaining to the fifth embodiment, the middle parts of a bus line leading from a first local bus 12b wired to a first cell array 11 to a second input/output unit 25 and a bus line leading from a second local bus 22b wired to a second cell array 21 to a first input/output unit 15 are merged into a common bus line 31. The common bus line 31 is laid to extend across a third region 30 existing between the first cell array 11 and the second cell array 21. Switches 13, 14, 23, 24 are provided to select either the first cell array 11 or the second cell array 12.

The semiconductor integrated circuit comprises a first region 10, a second region 20, and the third region 30 sandwiched between the first region 10 and the second region 20.

The first region 10 is a region in which the following are provided: the first cell array 11 comprising a plurality of cells, a plurality of first local buses 12a, 12b for data input to and output from the first cell array 11, and the first input/output unit 15 which is fewer in number than the number of the first local buses 12a, 12b. Although two first local buses 12a, 12b are shown in FIG. 6, the number of the first local buses may be more than two. The first input/output unit 15 may be, for example, a pad, circuit, or port. In the first region 10, there is disposed a first switch 13 which couples the first local bus 12*b* to the second input/output unit 25 via the common bus line 31 and couples the first local bus 12*a* to the first input/output unit 15, when the first cell array 11 is selected. The first switch 13 is controlled in a complementary fashion with respect to a second switch 23 by a controller (not shown). In the first region 10, there is also disposed a third switch 14 which does not couple the second local bus 22*a* to the first input/output unit 15 via the common bus line 31 and couples the first local bus 12*a* to the first input/output unit 15, when the first cell array 11 is selected, and couples the second local bus 22*a* to the first input/output unit 15 via the common bus line 31 and does not couple the first local bus 12*a* to the first input/output unit 15, when the second cell array 21 is selected. The third switch 14 corresponds to the multiplexer circuit and is controlled by the controller (not shown) so that it does not operate in unison with a fourth switch 24 (to avoid that both lines leading to the common bus line 31 are turned ON at the same time).

The second region 20 is a region in which the following are provided: the second cell array 21 comprising a plurality of cells, a plurality of second local buses 22*a*, 22*b* for data input to and output from the second cell array 21, and the second input/output unit 25 which is fewer in number than the number of the second local buses 22*a*, 22*b*. Although two second local buses 22*a*, 22*b* are shown in FIG. 6, the number of the second local buses may be more than two. The second input/output unit 25 may be, for example, a pad, circuit, or port. In the second region 10, there is also disposed a second switch 23 which couples the second local bus 22*a* to the first input/output unit 15 via the common bus line 31 and couples the second local bus 22*b* to the second input/output unit 25, when the second cell array 21 is selected. The second switch 23 is controlled in a complementary fashion with respect to the first switch 13 by the controller (not shown). In the second region 20, there is also disposed the fourth switch 24 which does not couple the first local bus 12*b* to the second input/output unit 25 via the common bus line 31 and couples the second local bus 22*b* to the second input/output unit 25, when the second cell array 21 is selected, and couples the first local bus 12*b* to the first input/output unit 15 via the common bus line 31 and does not couple the second local bus 22*b* to the second input/output unit 25, when the first cell array 11 is selected. The fourth switch 24 corresponds to the multiplexer circuit and is controlled by the controller (not shown) so that it does not operate in unison with the third switch 14 (to avoid that both lines leading to the common bus line 31 are turned ON at the same time).

The third region 30 is a region sandwiched between the first region 10 and the second region 20. The common bus line 31 is laid across the third region 30. The common bus line 31 is a bus line into which the middle parts of a bus line leading from the first local bus 12*b* to the second input/output unit 25 and a bus line leading from the second local bus 22*a* to the first input/output unit 15 are merged. The common bus line 31 provides coupling between the first local bus 12*b* and the second input/output unit 25, when the first cell array 11 is selected, and provides coupling between the second local bus 22*a* and the first input/output unit 15, when the second cell array 21 is selected. The common bus line 31 is fewer in number than the number of the first local buses 12*a*, 12*b* and the second local buses 22*a*, 22*b* in either case.

According to the fifth embodiment, the same advantageous effect as the first embodiment is produced.

Embodiments and examples of the invention disclosed herein may be changed or modified within the scope of the entire disclosure of the invention (including the scope of the claims) and based on the basic technical concept thereof. A variety of combinations and selections of diverse disclosed elements may be made within the scope of the claims of the present invention. That is, it will be appreciated that the present invention embraces the entire disclosure thereof including the scope of the claims and variants and modifications that may be implemented by those skilled in the art based on the technical concept of the invention.

What is claimed is:

1. A semiconductor integrated circuit comprising:
    a circuit unit which is divided into a plurality of banks and processes multiple bits of data;
    a plurality of input/output circuits which perform input and output of multiple bits of data; and
    a plurality of bus lines which provide electrical coupling between the respective data input/output circuits and the circuit unit,
    wherein, among the bus lines, two or more bus lines laid to extend laterally along the horizontal sides of the banks and coupled to different banks include a common bus line adapted as a shared bus line into which the middle parts of the bus lines are merged.

2. The semiconductor integrated circuit according to claim 1,
    wherein the circuit unit comprises a memory cell array in which memory cells, each holding one bit of data, are arrayed in a matrix, and
    wherein the memory cell array is electrically coupled to the corresponding bus lines via a plurality of data buffer circuits disposed for each one of the bits.

3. The semiconductor integrated circuit according to claim 1, wherein each of the input/output circuits is electrically coupled to the corresponding two or more bus lines via a multiplexer circuit performing a switchover according to selection of one of the banks.

4. The semiconductor integrated circuit according to claim 1, wherein there are two or more common bus lines having equal lengths out of the common bus lines.

5. The semiconductor integrated circuit according to claim 1, wherein there are two or more common bus lines that do not contact with each other on a same horizontal line out of the common bus lines.

6. A semiconductor integrated circuit comprising:
    in a first region,
    a first cell array including a plurality of cells;
    a plurality of first local buses for data input to and output from the first cell array; and
    a first input/output unit which is fewer in number than the number of the first local buses,
    in a second region,
    a second cell array including a plurality of cells;
    a plurality of second local buses for data input to and output from the second cell array; and
    a second input/output unit which is fewer in number than the number of the second local buses, and
    in a third region sandwiched between at least the first region and the second region,
    a common bus wire which provides coupling between a given one of the first local buses and the second input/output unit, when the first cell array is selected, and provides coupling between a given one of the second local buses and the first input/output unit, when the second cell array is selected, wherein the common bus line is fewer in number than the number of the first local buses and the second local buses in either case.

7. The semiconductor integrated circuit according to claim 6, wherein the number of the first local buses and the second local buses is two or more, respectively.

8. The semiconductor integrated circuit according to claim 6, further comprising:
   a first switch which is disposed in the first region, couples a given one of the first local buses to the second input/output unit via the common bus line, and couples another given one of the first local buses to the first input/output unit, when the first cell array is selected; and
   a second switch which is disposed in the second region, couples a given one of the second local buses to the first input/output unit via the common bus line and couples another given one of the second local buses to the second input/output unit, when the second cell array is selected, wherein the second switch is controlled in a complementary fashion with respect to the first switch.

9. The semiconductor integrated circuit according to claim 6, further comprising:
   a third switch which is disposed in the first region, does not couple a given one of the second local buses to the first input/output unit via the common bus line and couples another given one of the first local buses to the first input/output unit, when the first cell array is selected, and couples a given one of the second local buses to the first input/output unit via the common bus line and does not couple another given one of the first local buses to the first input/output unit, when the second cell array is selected; and
   a fourth switch which is disposed in the second region, does not couple a given one of the first local buses to the second input/output unit via the common bus line and couples another given one of the second local buses to the second input/output unit, when the second cell array is selected, and couples a given one of the first local buses to the first input/output unit via the common bus line and does not couple another given one of the second local buses to the second input/output unit, when the first cell array is selected.

* * * * *